(12) United States Patent
Tu

(10) Patent No.: US 7,233,202 B2
(45) Date of Patent: Jun. 19, 2007

(54) AMPLIFIER WITH INCREASED BANDWIDTH AND METHOD THEREOF

(75) Inventor: Chuan-Ping Tu, Hsin-Chu (TW)

(73) Assignee: Realtek Semiconductor Corp., HsinChu (TW)

(*) Notice: Subject to any disclaimer, the term of this patent is extended or adjusted under 35 U.S.C. 154(b) by 96 days.

(21) Appl. No.: 10/906,932

(22) Filed: Mar. 14, 2005

(65) Prior Publication Data

US 2006/0202758 A1 Sep. 14, 2006

(51) Int. Cl.
*H03F 3/45* (2006.01)
(52) U.S. Cl. .................................. 330/253; 330/311
(58) Field of Classification Search .............. 330/311
See application file for complete search history.

(56) References Cited

U.S. PATENT DOCUMENTS

| | | | | |
|---|---|---|---|---|
| 5,604,464 A | * | 2/1997 | Hwang et al. | ............... 330/253 |
| 6,326,846 B1 | * | 12/2001 | Brandt | ........................ 330/253 |
| 6,353,361 B1 | | 3/2002 | Sun | |
| 6,380,806 B1 | | 4/2002 | Ang | |
| 6,717,467 B2 | * | 4/2004 | Renous et al. | ............... 330/253 |
| 2003/0001075 A1 | | 1/2003 | Mukherjee et al. | |
| 2005/0017797 A1 | | 1/2005 | Kwan et al. | |
| 2005/0162232 A1 | | 7/2005 | Etoh | |
| 2006/0091952 A1 | * | 5/2006 | Siniscalchi | ................... 330/253 |

OTHER PUBLICATIONS

Anna M. Durham et al, "High-Linearity Continuous-Time Filter in 5-V VLSI CMOS", IEEE Journal of Solid-State Circuits. vol. 27. No. 9. Sep. 1992, pp. 1270-1276.

* cited by examiner

*Primary Examiner*—Robert Pascal
*Assistant Examiner*—Alan Wong
(74) *Attorney, Agent, or Firm*—Winston Hsu

(57) ABSTRACT

An amplifier with increased bandwidth by current injection and a method thereof. The amplifier includes an input stage for receiving a first input signal, a load stage coupled to the input stage for generating a first output signal, a first current source coupled to the input stage for allowing a predetermined current to flow, and a second current source, coupled to the input stage, for injecting a first current into the input stage for outputting the first output signal.

14 Claims, 3 Drawing Sheets

AMPLIFIER WITH INCREASED BANDWIDTH AND METHOD THEREOF

BACKGROUND OF INVENTION

1. Field of the Invention

The present invention relates to an amplifier, and more particularly, to an amplifier with increased bandwidth by current injection.

2. Description of the Prior Art

Operational amplifiers are one of the most widely used structures in modern day engineering. They can have many applications ranging from buffers and filters to analog-to-digital converters. Where high performance is required, such as a high speed, high resolution analog-to-digital converter, an operational amplifier having both high gain and high bandwidth is necessary.

Please refer to FIG. 1. FIG. 1 shows a conventional telescopic operational amplifier 10. It comprises a plurality of transistors M1-M9. Matched transistors M1 and M2 serve as an input stage 12 for respectively receiving a non-inverting input $V_{ip}$ and an inverting input $V_{in}$, while transistors M3-M8 biased by voltages $V_{bn}$, $V_{bp1}$, $V_{bp2}$ act as a load stage 14 (i.e., an active load). The remaining transistor M9 is biased by voltage $V_{cmfb}$, and is the tail transistor acting as a current source for sinking a constant reference current $I_Q$, thereby steering the currents $I_1$ and $I_2$. Since transistors M5 and M6 are a matched pair and transistors M7 and M8 are a matched pair, currents $I_1$ and $I_2$ therefore have the same current value. If both transistors M1 and M2 are turned on, $I_1$ is equal to half $I_Q$, and $I_1$ is equal to $I_2$. As shown in FIG. 1, both the non-inverting output $V_{on}$ and the inverting output $V_{op}$ are coupled to an output capacitor $C_0$. A telescopic configuration is often a preferred configuration because telescopic operational amplifiers consume less power than other topologies. They also have the added advantage of high speed. The telescopic configuration is well known to those skilled in the art, and therefore is not described in detail here.

The frequency response of an operational amplifier is the response of the circuit in the frequency domain. In other words, if the circuit is given a sinusoidal input the response should be a sinusoidal output of the same frequency, but amplified by the open loop gain, $A_0$. This frequency response can be modeled as a low pass function.

$$H(s) = \frac{A_0}{1 + \frac{s}{\omega_p}} \qquad \text{Equation (1)}$$

where $\omega_p$ is the dominate pole and $s = j\omega$

For frequencies much greater than $\omega_p$, i.e. $\omega \gg \omega_p$, we can approximate the gain, A, to be:

$$A(j\omega) = \frac{A_0 \omega_p}{j\omega} \qquad \text{Equation (2)}$$

$$|A(j\omega)| = \frac{A_0 \omega_p}{\omega} \qquad \text{Equation (3)}$$

Therefore, putting this result back into equation (1), we can obtain the unity-gain bandwidth $\omega_u$:

$$\omega_u = A_0 \omega_p \qquad \text{Equation (4)}$$

The unity gain bandwidth can also be written in terms of device transconductance, gm, and output resistance, $r_0$. Equation (4) then becomes:

$$\omega_u = \frac{gm \times r_0}{r_0 C_0} = \frac{gm}{C_{op} + C_{load}} \qquad \text{Equation (5)}$$

From equation (5) it can be seen that the unity gain bandwidth $\omega_u$ is a function of device transconductance gm, and total output capacitance $C_0$. The total output capacitance includes parasitic junction capacitance $C_{op}$, and capacitive load $C_{load}$ driven by the operational amplifier 10. Therefore, the way to increase bandwidth is by increasing gm or by decreasing the output capacitance $C_0$. $C_{load}$ cannot be decreased because it is determined by circuit specification and hence cannot be decreased for a specific application. Furthermore, the parasitic capacitance dominates the capacitive load, so decreasing $C_{load}$ would only have a minimal effect. To increase gm would require a larger device, which then leads to more parasitic capacitance, as the device size cannot be increased without limits. This gain-bandwidth relation therefore creates an upper level bandwidth limit.

SUMMARY OF INVENTION

It is therefore one of the objectives of the claimed invention to provide an amplifier with increased bandwidth by current injection and a related method thereof.

It is therefore one of the objectives of the claimed invention to provide an amplifier. The amplifier with current injection has an increased bandwidth while maintaining a high gain.

It is therefore one of the objectives of the claimed invention to provide an amplifier. The amplifier does not require increased power consumption or circuit area.

Briefly described, the present invention discloses an amplifier. The amplifier comprises an input stage for receiving a first input signal; a load stage coupled to the input stage for generating a first output signal; a first current source coupled to the input stage for allowing a predetermined current to flow; and a second current source, coupled to the input stage, for injecting a first current into the input stage for the first output signal.

In addition, a method for increasing the bandwidth of an amplifier is disclosed. The method comprises providing the amplifier with an input stage for receiving a first input signal, a load stage coupled to the input stage for outputting a first output signal, and a predetermined current source coupled to the input stage for allowing a fixed current to flow; and providing a first current and injecting the first current into the input stage for outputting the first output signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
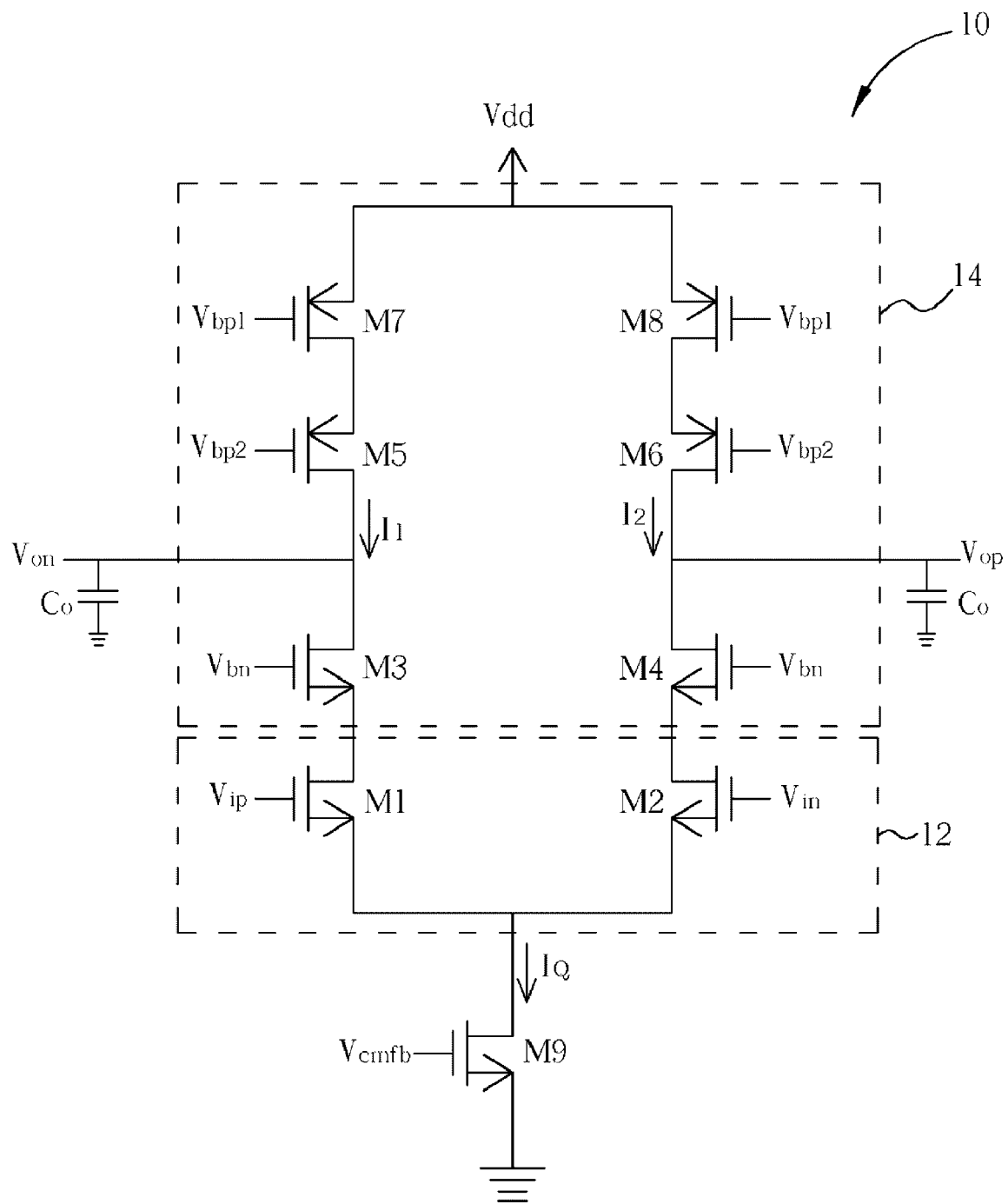
FIG. 1 is a diagram illustrating a conventional telescopic operational amplifier.
Figure 2:
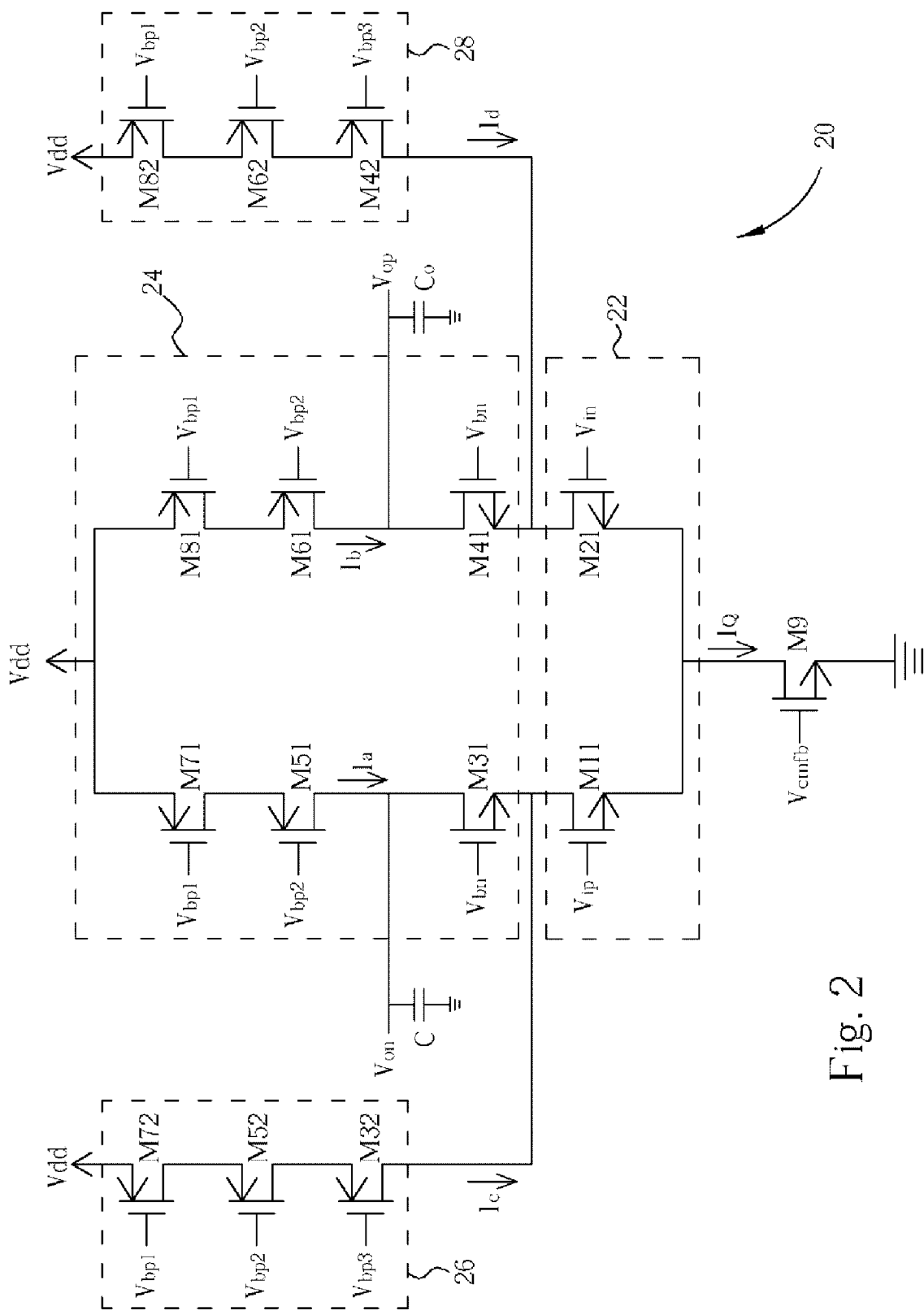
FIG. 2 is a diagram of a telescopic operational amplifier according to a first embodiment of the present invention.

Please refer to FIG. 2. FIG. 2 is a diagram of a telescopic operational amplifier 20 with current injection according to a first embodiment of the present invention, for increasing the bandwidth while maintaining a high gain. The telescopic operational amplifier 20 includes an input stage 22, which has two transistors M1 and M2, and a load stage 24, which has a plurality of transistors M31, M41, M51, M61, M71, M81. The transistor M9 acts as a current source for sinking a constant reference current $I_O$, thereby steering the currents $I_a$-$I_d$. If both transistors M1 and M2 are turned on, the collective currents $I_a$ and $I_c$ are equal to the current $I_1$ shown in FIG. 1, and the collective currents $I_b$ and $I_d$ are equal to the current $I_2$ shown in FIG. 1. Please note that the circuit architecture of the input stage 22 and load stage 24 is substantially the same as that of the input stage 12 and load stage 14 shown in FIG. 1. The amplifier 20 of the present invention further comprises extra current sources 26 and 28.

As shown in FIG. 2, a series of electrically connected transistors M72, M52 and M32 are coupled to the drain of the transistor M1, and a series of electrically connected transistors M82, M62 and M42 are coupled to the drain of the transistor M2, for respectively injecting a current $I_c$ and a current $I_d$ into the input stage 22. The transistors M72 and M82 are biased by a voltage $V_{bp1}$, M52 and M62 are biased by a voltage $V_{bp2}$, and M32 and M42 are biased by a voltage $V_{bp3}$. Additionally, an inverting output $V_{on}$ coupled to an output capacitor $C_0$ is coupled to the drain of the transistor M31 and an non-inverting output $V_{op}$ coupled to an output capacitor $C_0$ is coupled to the drain of the transistor M41. In an embodiment, transistors M32, M42, M51, M52, M61, M62, M71, M72, M81, M82 are PMOS transistors, and transistors M1, M2, M9, M31, M41 are NMOS transistors. Please note this amplifier configuration is merely an embodiment of the present invention and is not meant to be a limitation.

In an embodiment, both of the current sources 26, and 28 are p-type current sources. Since the transistor M9 still sinks the reference current $I_O$, the original currents $I_1$, $I_2$ shown in FIG. 1 are changed due to the injected currents $I_c$, $I_d$. In order to maintain the same bias condition, the size of the devices is scaled, according to the change of current of each device. Assume that $I_a$ is set to $k*I_1$. Therefore, the channel aspect ratio (W/L) is adjusted accordingly. In other words, for transistor M71 as compared to transistor M7 in FIG. 1, the channel aspect ratio is:

$$\left(\frac{W}{L}\right)_{M71} = k * \left(\frac{W}{L}\right)_{M7} \text{ where } 0 < k < 1 \qquad \text{Equation (6)}$$

Similarly, for transistor M81 as compared to transistor M8 in FIG. 1:

$$\left(\frac{W}{L}\right)_{M81} = (1-k) * \left(\frac{W}{L}\right)_{M8} \text{ where } 0 < k < 1 \qquad \text{Equation (7)}$$

The frequency response for the operational amplifier 20 can still be modeled as a low-pass function as shown by equation (1). The dominate pole $\omega_p$, however, is now:

$$\omega_p = \frac{1}{r_0 C_0} = \frac{1}{r_0(kC_{op} + C_{load})} \qquad \text{Equation (8)}$$

This is because the device size has decreased by a factor of k, where $0 < k < 1$, and therefore the parasitic capacitance $C_{op}$ has also decreased by a factor of k.

Putting this result in the equation for unity-gain bandwidth $\omega_u$, it can be shown that:

$$\omega_u = \frac{gm \times r_0}{r_0 C_0} = \frac{gm}{r_0(kC_{op} + C_{load})} \qquad \text{Equation (9)}$$

Due to the smaller device parasitic capacitance $C_{OP}$, the unity-gain bandwidth $\omega_u$, compared with the prior art unity-gain bandwidth, has been increased by a factor:

$(C_{op} + C_{load})/(kC_{op} + C_{load})$. Please note that the circuit size of the operational amplifier 20 is substantially the same as that of the operational amplifier 10 shown in FIG. 1.

Figure 3:
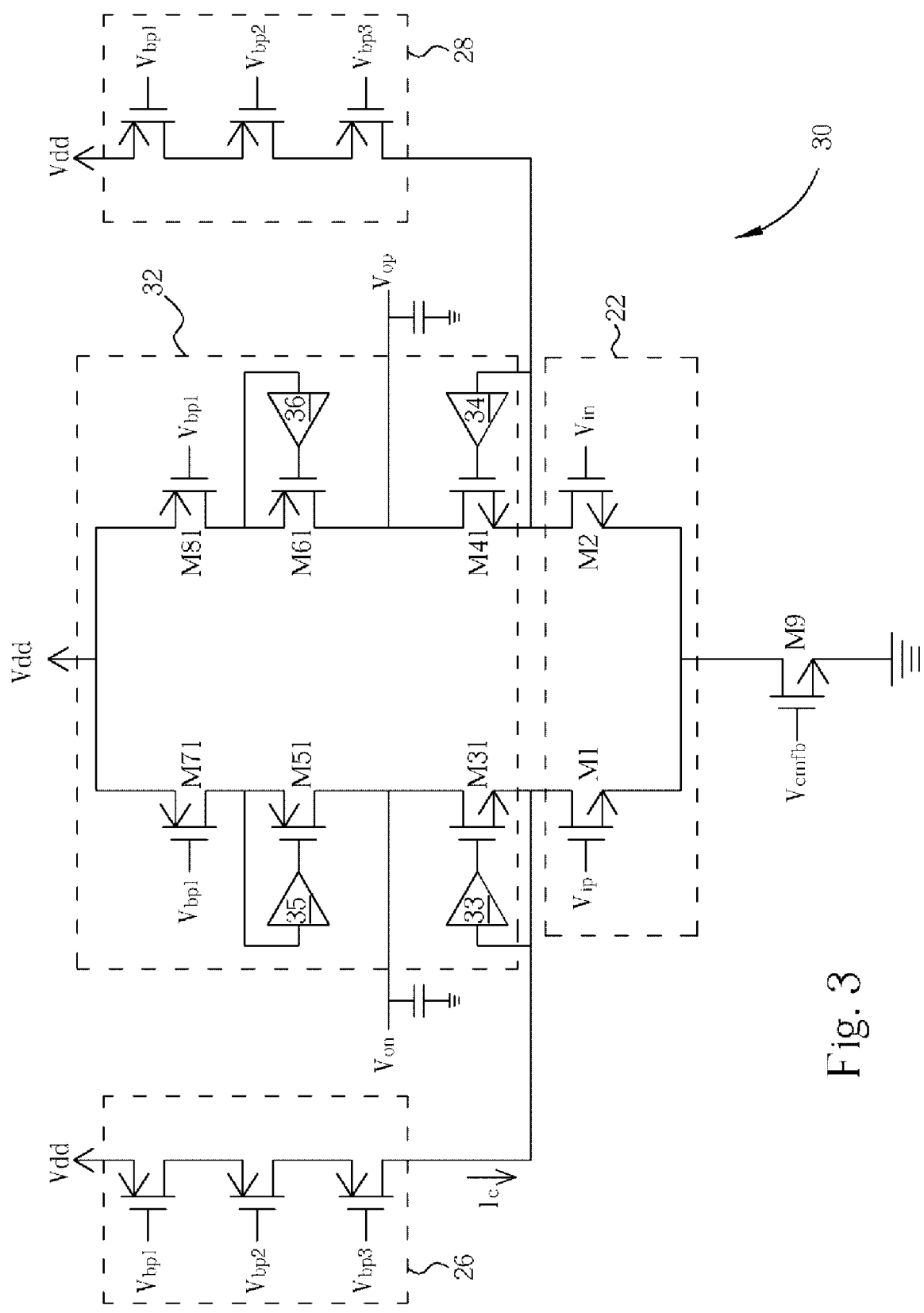
FIG. 3 is a diagram of a telescopic operational amplifier according to a second embodiment of the present invention.

Please refer to FIG. 3. FIG. 3 is a diagram of a telescopic operational amplifier 30, with gain boosting and current injection, according to a second embodiment of the present invention, for increasing the bandwidth while also increasing the gain. The telescopic operational amplifier 30 is similar to the above telescopic operational amplifier 20. The lengthy description of the same components, i.e., the transistor M9, the input stage 22 and the current sources 26, 28, is not repeated. As shown in FIG. 3, the key difference is that the telescopic operational amplifier 30 has a load stage 32 including a plurality of amplifiers 33, 34, 35, 36 used to enable the gain boosting. Since the gain boosting is well known to those skilled in this art, further description is omitted for brevity. Compared with the telescopic operational amplifier 20, the telescopic operational amplifier 30 has an increased DC gain $A_0$ due to the gain boosting. In addition, with the currents injected into the input stage 22 by the current sources 26 and 28, the bandwidth of the operational amplifier 30 is thereby increased.

Please note that, in the above-mentioned embodiments, the current injection is applied to a differential pair. However, both of the current injection configurations shown in FIG. 2 and FIG. 3 are just exemplary embodiments, and are not meant to be limitations.

The embodiments of the present invention have an increased bandwidth without sacrificing gain. The circuit area and power consumed are still approximately the same but the parasitic capacitance has been decreased. The current injection technique can also be used in a gain boosted operational amplifier, therefore allowing both the bandwidth and the gain to be increased at the same time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifier comprising:
an input stage for receiving a first input signal;
a load stage coupled to the input stage, the load stage for outputting a first output signal;

a first current source coupled to the input stage for allowing a predetermined current to flow; and a second current source coupled to the input stage and coupled in parallel to the load stage, the second current source for injecting a first current into the input stage;

wherein the load stage is an active load comprises a plurality of electrically coupled transistors and at least an additional amplifier coupled to two nodes of a predetermined transistor from among the transistors of the load stage.

2. The amplifier of claim 1 wherein the input stage comprises a transistor, the first input signal inputted into the gate of the transistor, and the first current injected into the drain of the transistor.

3. The amplifier of claim 1 wherein the second current source is a p-type current source.

4. The amplifier of claim 1 wherein the predetermined transistor has the source and the gate coupled to the additional amplifier.

5. The amplifier of claim 1 wherein the input stage further receives a second input signal, the load stage further outputs a second output signal, and the amplifier further comprises:

a third current source coupled to the input stage, the third current source for injecting a second current into the input stage.

6. The amplifier of claim 5 wherein the input stage comprises:

a first transistor coupled to the second current source for receiving the first input signal; and a second transistor coupled to the third current source for receiving the second input signal;

the load stage comprises:

a plurality of electrically coupled third transistors coupled to the first transistor for generating the first output signal; and a plurality of electrically coupled fourth transistors coupled to the second transistor for generating the second output signal;

wherein the input stage, the load stage, and the first current source are configured in a telescopic topology.

7. A method for increasing the bandwidth of an amplifier, comprising:

providing the amplifier with an input stage for receiving a first input signal, a load stage for outputting a first output signal, and a first current source for allowing a predetermined current to flow; and providing a second current source coupled in parallel to the load stage for injecting a first current into the input stage;

wherein the load stage comprises a plurality of electrically coupled transistors and at least an additional amplifier coupled to two nodes of a predetermined transistor from among the transistors of the load stage.

8. The method of claim 7 wherein the input stage comprises an NMOS transistor, the first input signal is inputted into the gate of the NMOS transistor, and the first current is injected into the drain of the NMOS transistor.

9. The method of claim 7 wherein the first current source is an n-type current source.

10. The method of claim 7 wherein the predetermined transistor having the source and the gate coupled to the additional amplifier.

11. The method of claim 7 wherein the input stage further receives a second input signal, the load stage further outputs a second output signal, and the method further comprises:

providing the amplifier with a third current source coupled to the input stage, the third current source for injecting a second current into the input stage.

12. An apparatus for amplifying a first input signal to generate a first output signal, the apparatus comprising:

a telescopic amplifier for receiving the input signal and outputting the first output signal, the telescopic amplifier comprising a load stage; and a first current source coupled in parallel to the load stage of the telescopic amplifier, the first current source for injecting a first current into the telescopic amplifier;

wherein the load stage comprises a plurality of electrically coupled transistors and at least an additional amplifier coupled to two nodes of a predetermined transistor from among the transistors of the load stage.

13. The apparatus of claim 12 wherein the predetermined transistor has the source and the gate coupled to the additional amplifier.

14. The apparatus of claim 12 wherein the telescopic amplifier further receives a second input signal and outputs a second output signal, and the apparatus further comprises:

a second current source coupled to the telescopic amplifier, the second current source for injecting a second current into the telescopic amplifier.

* * * * *